(12) United States Patent  
Kouno et al.

(10) Patent No.: US 9,129,851 B2  
(45) Date of Patent: Sep. 8, 2015

(54) SEMICONDUCTOR DEVICE

(71) Applicant: DENSO CORPORATION, Kariya, Aichi-pref. (JP)

(72) Inventors: Kenji Kouno, Gifu (JP); Shinji Amano, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/357,859

(22) PCT Filed: Oct. 9, 2012

(86) PCT No.: PCT/JP2012/006455  
§ 371 (c)(1),  
(2) Date: May 13, 2014

(87) PCT Pub. No.: WO2013/080417  
PCT Pub. Date: Jun. 6, 2013

(65) Prior Publication Data  
US 2014/0299915 A1    Oct. 9, 2014

(30) Foreign Application Priority Data

Nov. 30, 2011    (JP) .................................. 2011-262055  
Aug. 31, 2012    (JP) .................................. 2012-191627

(51) Int. Cl.  
*H01L 29/00* (2006.01)  
*H01L 21/00* (2006.01)  
(Continued)

(52) U.S. Cl.  
CPC .......... *H01L 29/1095* (2013.01); *H01L 21/263* (2013.01); *H01L 29/0834* (2013.01);  
(Continued)

(58) Field of Classification Search  
CPC ............ H01L 29/0834; H01L 29/1095; H01L 29/167; H01L 29/7395; H01L 29/36; H01L 29/32; H01L 29/7802; H01L 29/7397; H01L 29/861; H01L 21/263  
See application file for complete search history.

(56) References Cited

U.S. PATENT DOCUMENTS 6,482,681 B1    11/2002    Francis et al.  
6,610,572 B1    8/2003    Takei et al.  
(Continued)

FOREIGN PATENT DOCUMENTS

JP    09-082955 A    3/1997  
JP    2005-340465 A    12/2005  
JP    2008-091853 A    4/2008

OTHER PUBLICATIONS

International Search Report of the International Searching Authority mailed Dec. 25, 2012 for the corresponding international application No. PCT/JP2012/006455 (with English translation).

(Continued)

*Primary Examiner* — Victor A Mandala  
*Assistant Examiner* — Quovaunda V Jefferson  
(74) *Attorney, Agent, or Firm* — Posz Law Group, PLC

(57) ABSTRACT

In a semiconductor device having a vertical semiconductor element configured to pass an electric current between an upper electrode and a lower electrode, a field stop layer includes a phosphorus/arsenic layer doped with phosphorus or arsenic and a proton layer doped with proton. The phosphorus/arsenic layer is formed from a back side of a semiconductor substrate to a predetermined depth. The proton layer is deeper than the phosphorus/arsenic layer. An impurity concentration of the proton layer peaks inside the phosphorus/arsenic layer and gradually, continuously decreases at a depth greater than the phosphorus/arsenic layer.

13 Claims, 13 Drawing Sheets

(51) Int. Cl.
  *H01L 29/10* (2006.01)
  *H01L 21/263* (2006.01)
  *H01L 29/32* (2006.01)
  *H01L 29/739* (2006.01)
  *H01L 29/08* (2006.01)
  *H01L 29/78* (2006.01)
  *H01L 29/861* (2006.01)

(52) U.S. Cl.
  CPC ............ *H01L29/32* (2013.01); *H01L 29/7395* (2013.01); *H01L 29/7397* (2013.01); *H01L 29/7802* (2013.01); *H01L 29/861* (2013.01)

(56) References Cited

U.S. PATENT DOCUMENTS

| | | | |
|---|---|---|---|
| 6,707,111 B2 * | 3/2004 | Francis et al. | ................ 257/362 |
| 7,195,994 B2 | 3/2007 | Schulze et al. | |
| 7,514,750 B2 | 4/2009 | Mauder et al. | |
| 7,538,412 B2 | 5/2009 | Schulze et al. | |
| 2001/0005036 A1 | 6/2001 | Porst et al. | |
| 2002/0121660 A1 | 9/2002 | Otsuki et al. | |
| 2005/0215042 A1 | 9/2005 | Hille et al. | |
| 2008/0315364 A1 | 12/2008 | Nemoto | |
| 2009/0184340 A1 | 7/2009 | Nemoto et al. | |
| 2009/0224284 A1 | 9/2009 | Nemoto | |
| 2011/0124160 A1 | 5/2011 | Nemoto | |
| 2014/0070268 A1 * | 3/2014 | Yoshimura et al. | ............ 257/139 |
| 2015/0069462 A1 * | 3/2015 | Mizushima | ................... 257/139 |

OTHER PUBLICATIONS

Written Opinion of the International Searching Authority mailed Dec. 25, 2012 for the corresponding international application No. PCT/JP2012/006455 (with English translation).

W. Wondrak et al. "Proton Implantation for Silicon Power Devices" Proceedings of 1988 International Symposium on Power Semiconductor Devices, Aug. 22-23, 1988. pp. 147-152, Japan.

\* cited by examiner

FIG. 1
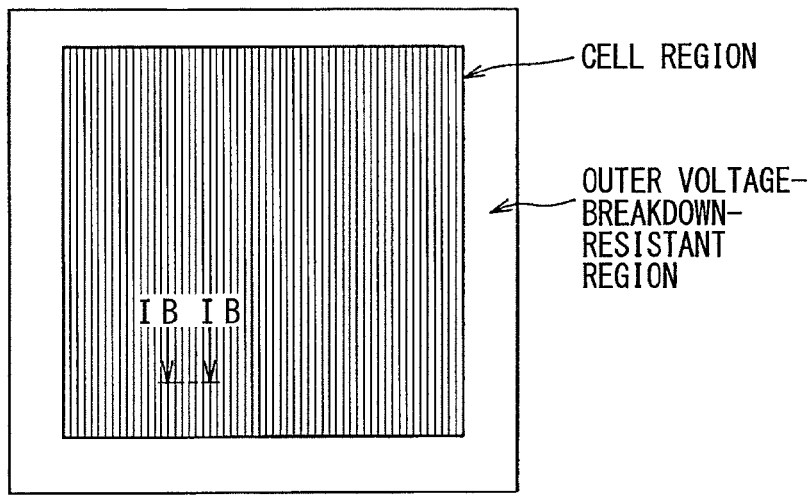
(a)
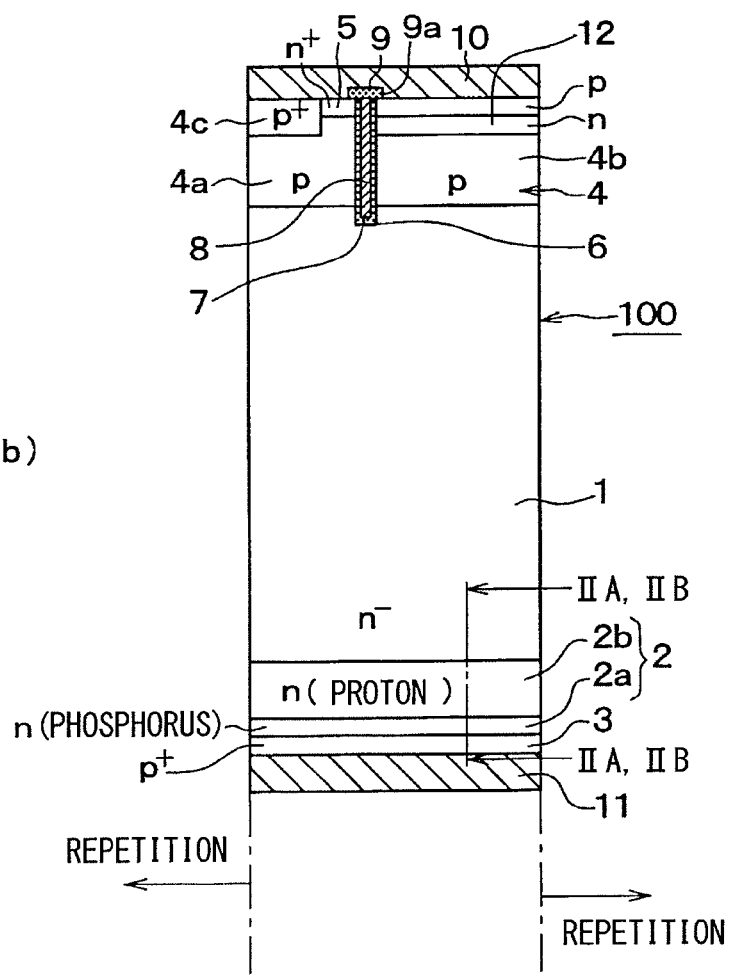
(b)

FIG. 2
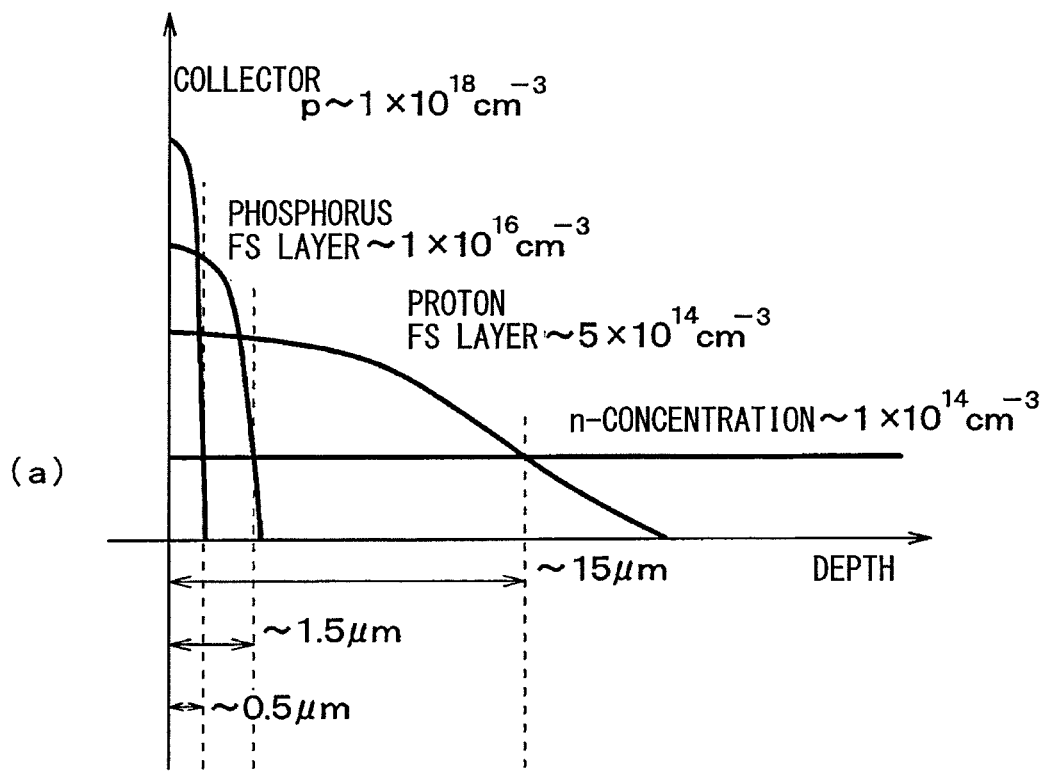
(a)
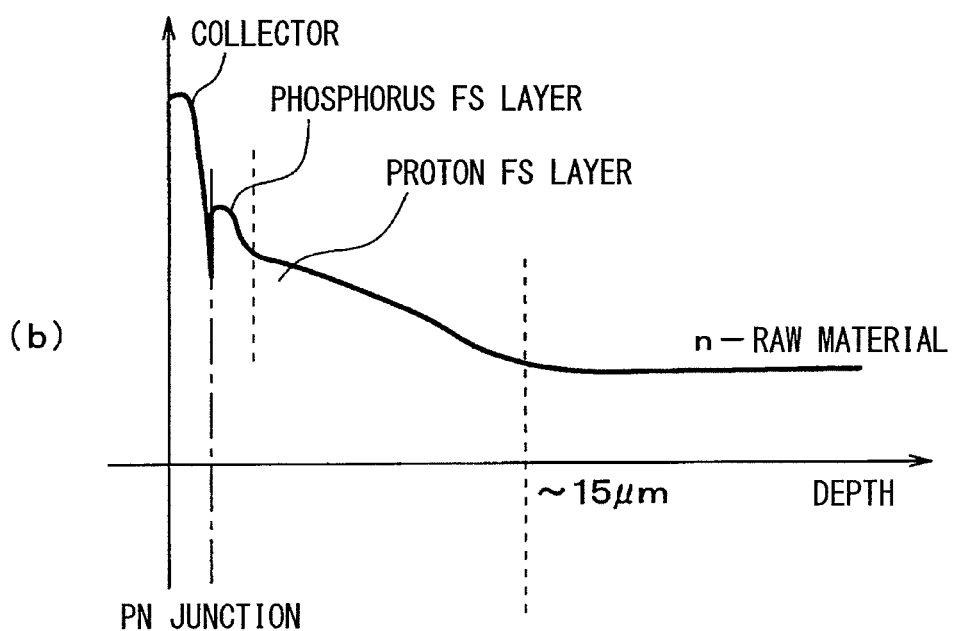
(b)

FIG. 3
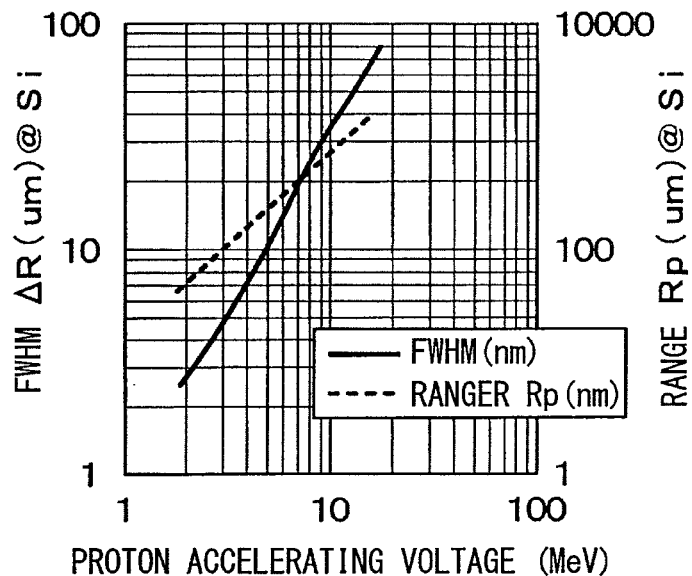
(a)
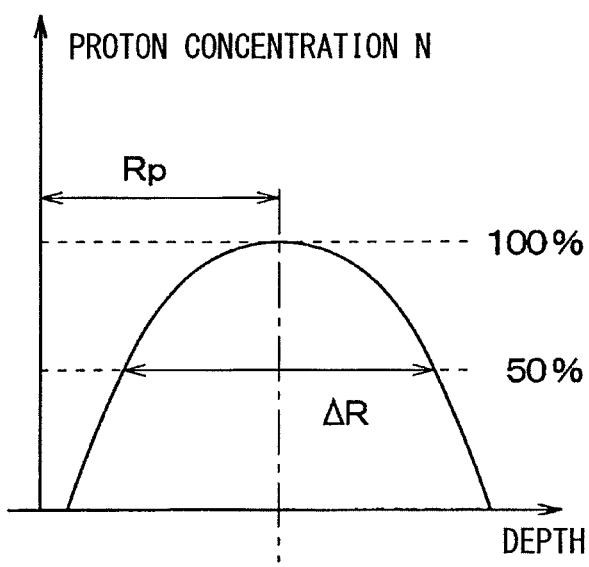
(b)

FIG. 11
(a)
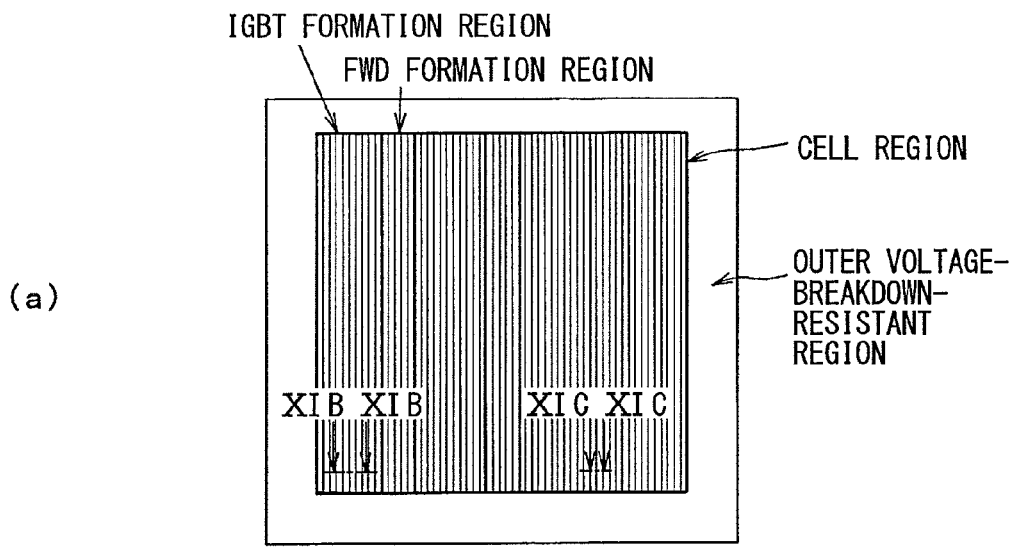
(b) (c)
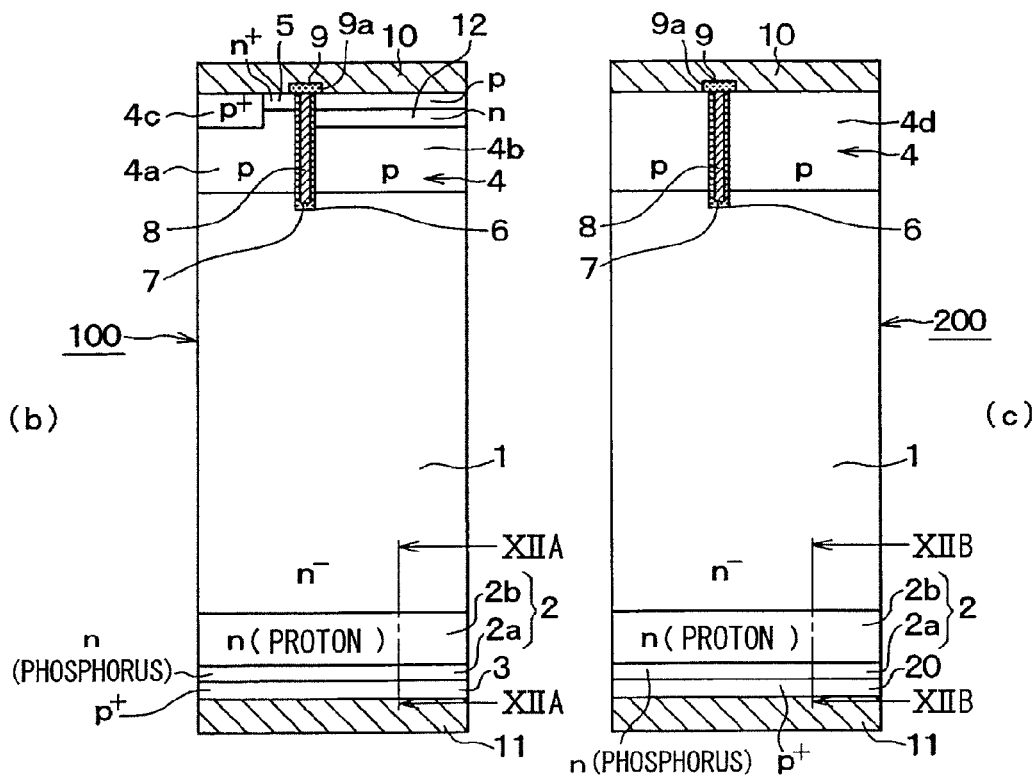

FIG. 12
(a)
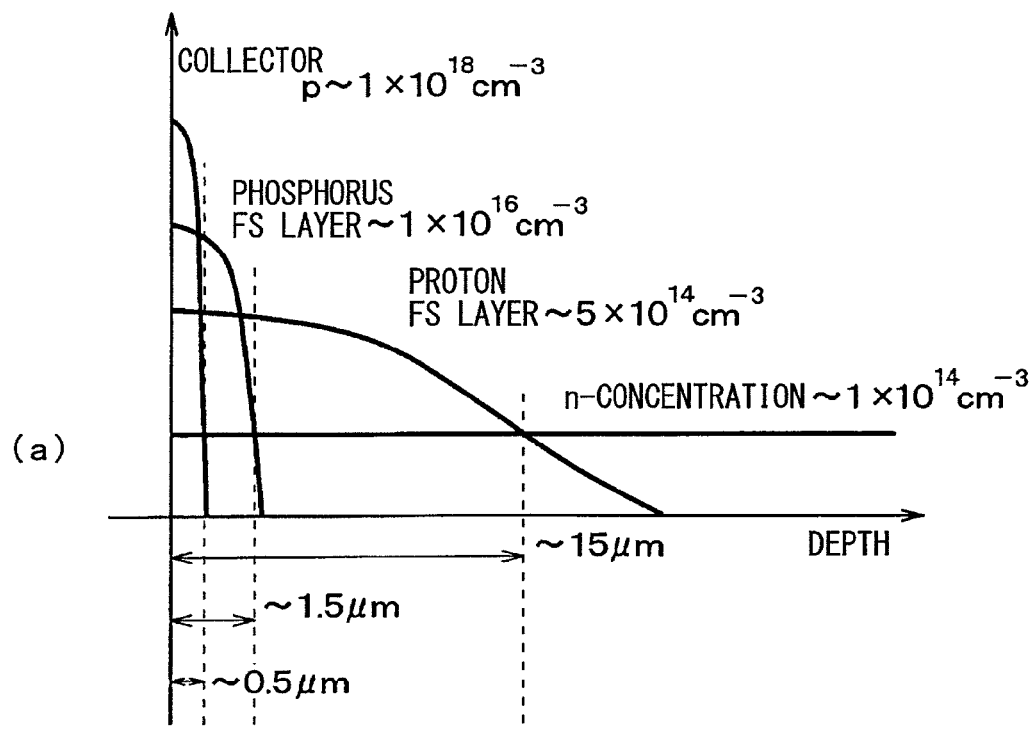
(b)
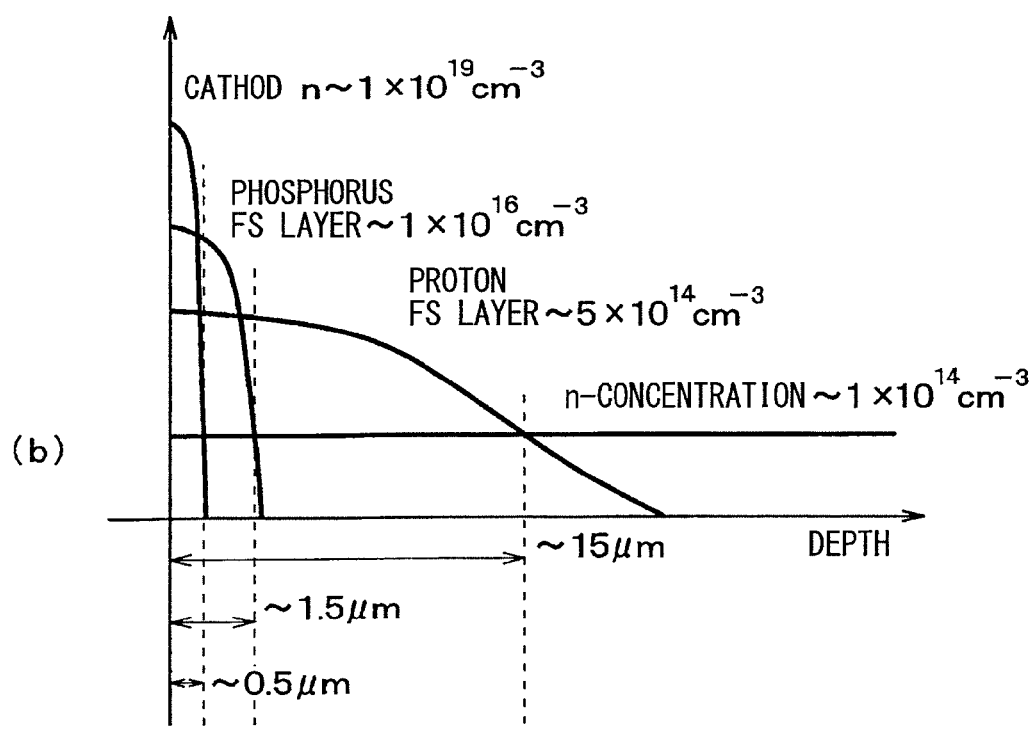

FIG. 13
(a)
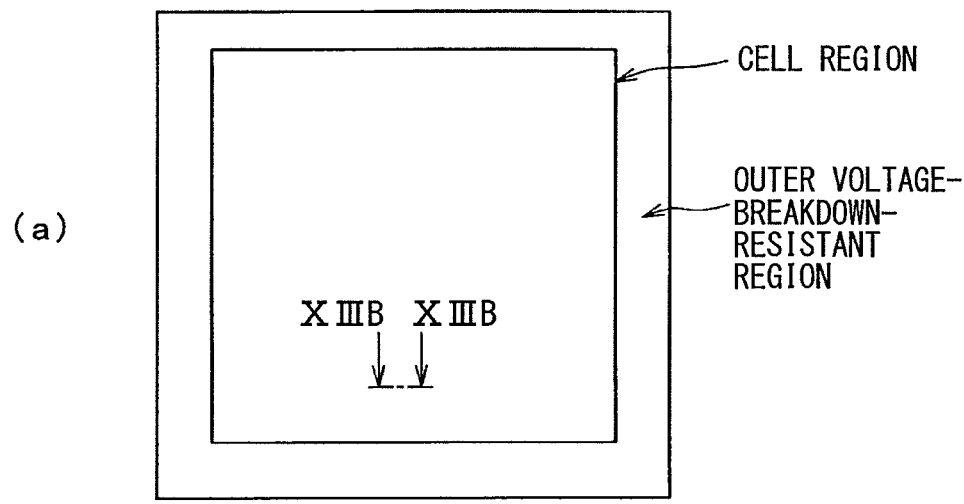
CELL REGION
OUTER VOLTAGE-BREAKDOWN-RESISTANT REGION
XIIIB XIIIB
(b)
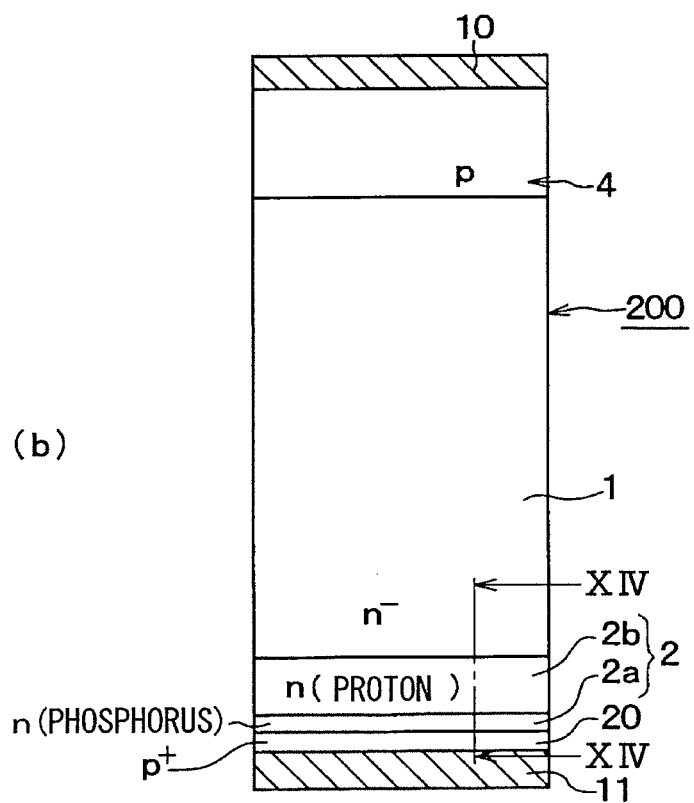

SEMICONDUCTOR DEVICE

CROSS REFERENCE TO RELATED APPLICATION

This application is a U.S. National Stage application of International Patent Application No. PCT/JP2012/006455 filed on Oct. 9, 2012, and is based on Japanese Patent Application No. 2011-262055 filed on Nov. 30, 2011 and 2012-191627 filed on Aug. 31, 2012, the contents of which are incorporated herein by reference.

TECHNICAL FIELD

The present disclosure relates to a semiconductor device having a vertical semiconductor element.

BACKGROUND

Conventionally, a semiconductor device having a vertical semiconductor element used for a power circuit such as an inverter or a DC-DC converter of an EHV has been known. In this semiconductor device, an IGBT is used as a vertical semiconductor element. In order to reduce a loss in a semiconductor device having an IGBT, an element structure called a field stop (hereinafter referred to as the FS) has been proposed and put to practical use. Specifically, a back surface of a substrate where an element is formed is shaved, and then an annealing process is performed after ion implantation of impurities such as phosphorus (P) or selenium (Se) into the back surface is performed. Thus, a FS layer having an impurity concentration greater than a raw material concentration of the substrate is formed. Such a FS layer reduces an extension of an electric field, prevents a breakdown voltage from being degraded in spite of the thinning, and reduces a loss.

However, when the FS layer is formed by ion implantation of phosphorus, it is formed at a shallow depth and sensitive to damage on the back side because the implantation depth is shallow. Therefore, if the damage extends to a depth greater than the FS layer, collector leakage occurs, and fabrication yield decreases. In contrast, when the FS layer is formed by ion implantation of selenium, the implantation depth is deep, and fabrication yield is improved. However, since selenium is not used in a normal IC manufacturing process, special equipment for handling selenium is required.

In this situation, the patent document 1 has proposed a technique for forming a deep FS layer by performing an annealing process after performing a doping process with proton using an accelerator. Further, the patent document 2 has proposed a technique for forming a FS layer by ion implantation of phosphorus in addition to proton. Furthermore, the patent documents 3 and 4 have proposed a technique for forming a FS layer with a multilayer structure by performing implantation of proton multiple times.

However, when proton is used as proposed in the patent documents 1-4, the activation ratio significantly decreases with an increase in the dose amount. Therefore, a long irradiation time is required to obtain practical concentration, and productivity is reduced.

FIG. 15 is a diagram showing the peak concentration and the activation ratio with respect to the dose amount of proton when a doping with proton is performed at an accelerating voltage of 4.3 MeV. As shown in this diagram, the activation ratio of proton significantly decreases with an increase in the dose amount of proton. In particular, at a high impurity concentration of about $1\times10^{15}$ cm$^{-3}$ necessary to form a FS layer, since the activation ratio is low, a proton irradiation time becomes long. For this reason, if a FS layer is formed by simply using proton, the manufacturing cost increases due to low productivity.

In the method disclosed in the patent document 2, a FS layer is formed by using phosphorus in addition to proton. However, the dose amount of proton is constant regardless of whether phosphorus is implanted or not, and the doping is performed so that the proton concentration peaks at a deep position. Therefore, the problem of the long proton irradiation time is not solved, and an electric field concentration occurs at a boundary between a FS layer and a drift layer, so that a breakdown voltage is reduced. Further, a surge is likely to occur at the time of the switching. Therefore, it is desired to reduce a switching surge without an increase in the manufacturing cost.

The above explanation is made by taking an IGBT as an example of a vertical semiconductor element. However, the same problems as discussed above can occur in a freewheeling diode (FWD), DMOS, and the like where a FS layer can be formed.

PRIOR ART

Patent Document

Patent Document 1: JP-B-3684962
Patent Document 2: JP-A-2009-176892
Patent Document 3: U.S. Pat. No. 7,514,750
Patent Document 4: JP-B-4128777

SUMMARY

In view of the above, it is an object of the present disclosure to provide a semiconductor device having a vertical semiconductor element in which an increase in a manufacturing cost is prevented, a breakdown voltage is ensured, and a switching surge is reduced.

According to a first aspect of the present disclosure, in a semiconductor device having a vertical semiconductor element configured to pass an electric current between an upper electrode and a lower electrode, a FS layer includes a phosphorus/arsenic layer doped with phosphorus or arsenic and a proton layer doped with proton. The phosphorus/arsenic layer is formed from a back side of a semiconductor substrate to a predetermined depth. The proton layer is deeper than the phosphorus/arsenic layer. An impurity concentration of the proton layer peaks inside the phosphorus/arsenic layer and gradually, continuously decreases at a depth greater than the phosphorus/arsenic layer.

As described above, the FS layer includes the phosphorus/arsenic and the proton layer, and the impurity concentration of the proton layer gradually decreases. Thus, as compared to when the FS layer is made of only proton, the impurity concentration of the proton layer can decrease. Accordingly, as compared to when the FS layer is formed by implantation of proton only, productivity is improved so that an increase in the manufacturing cost can be reduced.

Further, the impurity concentration of the proton layer gradually, continuously decreases at a depth greater than the phosphorus/arsenic layer from a back side of a drift layer. Thus, a difference in an n-type impurity concentration at a boundary between the proton layer and the drift layer becomes small. Therefore, it is possible to relieve an electric field concentration, ensure a breakdown voltage, and reduce a switching surge.

According to a second aspect of the present disclosure, a depth of the proton layer is defined as x, a concentration ratio of the proton layer with respect to the raw material concentration is defined as y, and x and y satisfy the following relationship: (formula 1) $y \geq 19.061 \times 10^{-0.00965x}$.

When the depth of the proton layer and the concentration ratio of the proton layer with respect to the raw material concentration are set to satisfy the relationship, the amount of a decrease in the breakdown voltage can be reduced, and breakdown-voltage yield can be improved.

According to a third aspect of the present disclosure, the depth of the proton layer is 20 μm or less, and the concentration ratio of the proton layer with respect to the raw material concentration is three times or more. Thus, the amount of the decrease in the breakdown voltage can be reduced.

According to a fourth aspect of the present disclosure, the depth of the proton layer is 20 μm or less, and the concentration ratio of the proton layer with respect to the raw material concentration is four times or more. Thus, the amount of the decrease in the breakdown voltage can be further reduced.

According to a fifth aspect of the present disclosure, the depth of the proton layer is 15 μm or less, and the concentration ratio of the proton layer with respect to the raw material concentration is four times or more. Thus, the amount of the decrease in the breakdown voltage can be reduced.

According to a sixth aspect of the present disclosure, the depth of the proton layer is 15 μm or less, and the concentration ratio of the proton layer with respect to the raw material concentration is seven times or more. Thus, the amount of the decrease in the breakdown voltage can be further reduced.

According to a seventh aspect of the present disclosure, the depth of the proton layer is 10 μm or less, and the concentration ratio of the proton layer with respect to the raw material concentration is seven times or more. Thus, the amount of the decrease in the breakdown voltage can be reduced.

According to an eighth aspect of the present disclosure, the depth of the proton layer is 10 μm or less, and the concentration ratio of the proton layer with respect to the raw material concentration is ten times or more. Thus, the amount of the decrease in the breakdown voltage can be further reduced.

According to a ninth aspect of the present disclosure, the depth of the proton layer is 7 μm or less, and the concentration ratio of the proton layer with respect to the raw material concentration is ten times or more. Thus, the amount of the decrease in the breakdown voltage can be reduced.

According to a tenth aspect of the present disclosure, the depth of the proton layer is 7 μm or less, and the concentration ratio of the proton layer with respect to the raw material concentration is fourteen times or more. Thus, the amount of the decrease in the breakdown voltage can be further reduced.

According to an eleventh aspect of the present disclosure, the vertical semiconductor device is an IGBT.

According to a twelfth aspect of the present disclosure, the vertical semiconductor device is an IGBT with a freewheeling diode.

According to a thirteenth embodiment of the present disclosure, the vertical semiconductor device is a diode.

BRIEF DESCRIPTION OF THE DRAWINGS

The above and other objects, features and advantages of the present disclosure will become more apparent from the following detailed description made with reference to the accompanying drawings. In the drawings:

FIG. 1(a) is a diagram illustrating a top layout view of a semiconductor device having an IGBT, as a vertical semiconductor element, according to a first embodiment of the present disclosure, and FIG. 1(b) is a diagram illustrating a cross-sectional view taken along the line IB-IB in FIG. 1(a);

FIG. 2(a) is a graph showing a designed impurity concentration profile in a cross-section taken along the line IIA-IIA in FIG. 1(b), and FIG. 2(b) is a graph showing a finished impurity concentration profile in a cross-section taken along the line IIB-IIB in FIG. 1(b);

FIG. 3(a) is a diagram illustrating a full width at half-maximum $\Delta R(\mu m)$ and a range Rp with respect to a proton accelerating voltage (MeV), and FIG. 3(b) is a diagram illustrating a relationship between a depth (range) Rp and a proton concentration N;

FIG. 4 is a graph illustrating a result of a simulation conducted to evaluate a relationship between an n-type impurity concentration of a proton FS layer 2b and a breakdown voltage while changing a width of a defect in a phosphorus FS layer 2a;

FIG. 5 is a graph illustrating a result of a simulation conducted to evaluate a relationship between an n-type impurity concentration of a proton FS layer 2b and a breakdown voltage while changing a width of a defect in a phosphorus FS layer 2a;

FIG. 6 is a graph illustrating a result of a simulation conducted to evaluate a relationship between an n-type impurity concentration of a proton FS layer 2b and a breakdown voltage while changing a width of a defect in a phosphorus FS layer 2a;

FIG. 11(a) is a diagram illustrating a top layout view of a semiconductor device having an IGBT with a diode, as a vertical semiconductor element, according to a second embodiment of the present disclosure, FIG. 11(b) is a diagram illustrating a cross-sectional view taken along the line XIB-XIB in FIG. 11(a), and FIG. 11(c) is a diagram illustrating a cross-sectional view taken along the line XIC-XIC in FIG. 11(a);

FIG. 12(a) is a graph showing an impurity concentration profile in a cross-section taken along the line XIIA-XIIA in FIG. 11(b), and FIG. 12(b) is a graph showing an impurity concentration profile in a cross-section taken along the line XIIB-XIIB in FIG. 11(c);

FIG. 13(a) is a diagram illustrating a top layout view of a semiconductor device having a diode, as a vertical semiconductor element, according to a third embodiment of the present disclosure, and FIG. 13(b) is a diagram illustrating a cross-sectional view taken along the line XIIIB-XIIB in FIG. 13(a);

DETAILED DESCRIPTION

Figure 4:
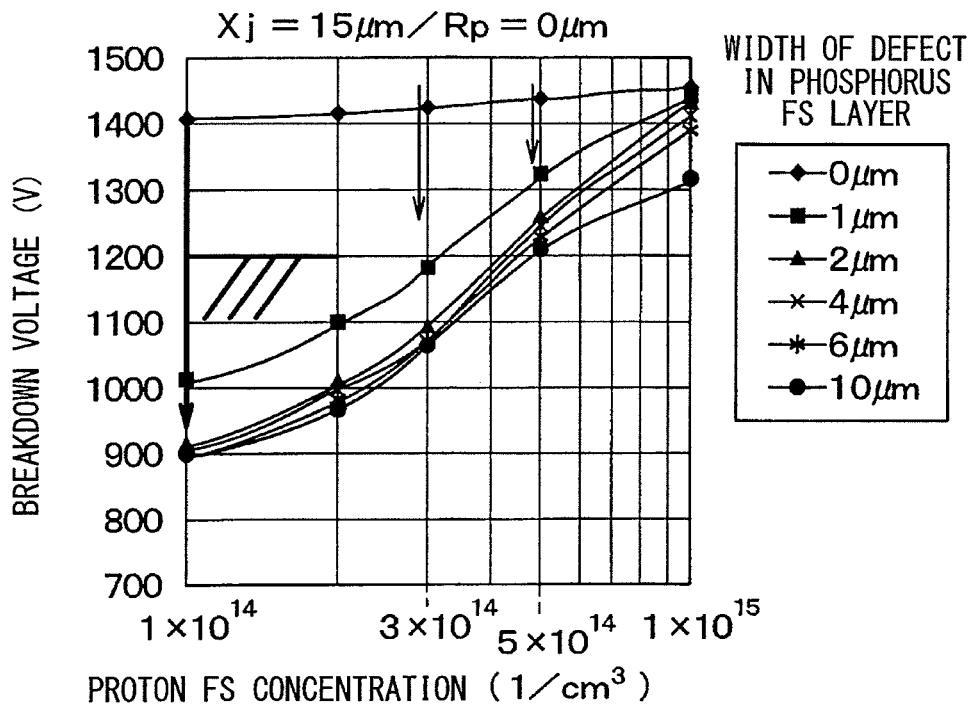

Embodiments of the present disclosure are described below with reference to the drawings in which like characters of reference indicate the same or equivalent parts.

First Embodiment

A first embodiment of the present disclosure is described. FIGS. 1(a) and (b) show a semiconductor device having an IGBT as a vertical semiconductor element. FIG. 1(a) is a diagram illustrating its top layout view, and FIG. 1(b) is a diagram illustrating its cross-sectional view taken along the line IB-IB in FIG. 1(a). FIGS. 2(a) and (b) are graphs showing impurity concentrations in a cross-section taken along the line IIA-IIA, IIB-IIB in FIG. 1(b). FIG. 2(a) shows a designed impurity concentration profile, and FIG. 2(b) shows a finished impurity concentration profile. The semiconductor device according to the present embodiment is described below with reference to these drawings.

As shown in FIG. 1(a), an IGBT formation region where an IGBT 100 shown in FIG. 1(b) is located is defined as a cell region, and an outer voltage-breakdown resistant region is located around the cell region. That is, the cell region is located in a central part of a chip which provides the semiconductor device, and the outer voltage-breakdown resistant region is located around the cell region, i.e., located on an outer part of the chip.

As shown in FIG. 1(b), in the semiconductor device according to the present embodiment, the IGBT 100 is formed in a semiconductor substrate which provides an n⁻-type drift layer 1. The n⁻-type drift layer 1 has a raw material concentration. As shown in FIG. 2, the n⁻-type drift layer 1 has an n-type impurity concentration of $1 \times 10^{14}$ cm$^{-3}$ or less and can be $0.75 \times 10^{14}$ cm$^{-3}$, for example.

In the IGBT formation region of the cell region, an n-type FS layer 2 is formed in a surface part of a back side of the n⁻-type drift layer 1. The FS layer 2 includes a phosphorus FS layer 2a and a proton FS layer 2b. The phosphorus FS layer 2a contains phosphorus as an impurity and is formed from the back side of the n⁻-type drift layer 1 to a predetermined relatively shallow depth. The proton FS layer 2b contains proton as an impurity and is formed from the back side of the n⁻-type drift layer 1 to a depth greater than that of the phosphorus FS layer 2a. For example, as shown in FIG. 2, the phosphorus FS layer 2a has a diffusion depth of 1.5 μm or less and has a n-type impurity concentration of $1 \times 10^{16}$ cm$^{-3}$ or less, and the proton FS layer 2b has a diffusion depth of 15 μm or less and has a n-type impurity concentration of $5 \times 10^{14}$ cm$^{-3}$ or less. It is preferable that the impurity concentration of the proton FS layer 2b is not less than $5 \times 10^{14}$ cm$^{-3}$. According to the present embodiment, for example, the impurity concentration of the proton FS layer 2b ranges from $3 \times 10^{14}$ cm$^{-3}$ to $5 \times 10^{14}$ cm$^{-3}$ inclusive. Further, the impurity concentration of the proton FS layer 2b peaks inside the phosphorus FS layer 2a and gradually, continuously decreases at a depth greater than the phosphorus FS layer 2a from the back side of the n⁻-type drift layer 1.

A p⁺-type impurity region 3 corresponding to a collector region is formed in a surface part of the FS layer 2. The p⁺-type impurity region 3 is formed by implantation of p-type impurities such as boron. For example, as shown in FIG. 2, the p⁺-type impurity region 3 can have a diffusion depth of 0.5 μm or less and has a p-type impurity concentration of $1 \times 10^{18}$ cm$^{-3}$ or less.

Further, a p-type region 4 having a thickness of, for example, about 3 μm is formed in a surface part of the n⁻-type drift layer 1. Multiple trenches 6 are formed in such a manner that they reach the n⁻-type drift layer 1 by penetrating the p-type region 4. The p-type region 4 is divided into multiple portions by the trenches 6. Specifically, the trenches 6 are arranged at a predetermined pitch (interval). The trenches 6 extend in parallel to each other in a top-bottom direction of the paper of FIG. 1(a), i.e., in a direction perpendicular to the paper of FIG. 1(b) to form a stripe structure. Alternatively, ends of the parallel trenches 6 can be joined to form a ring structure. For example, in the case of the ring structure, the trenches 6, each of which has the ring structure, are placed in groups of a predetermined number to form a multiple-ring structure.

The p-type region 4 is divided into multiple portions by adjacent trenches 6, and some of the portions are p-type channel regions 4a serving as channel regions. An n⁺-type impurity region 5 corresponding to an emitter region is formed in a surface part of the p-type channel region 4a. Out of the p-type regions 4 sectioned by the trenches 6, a channel is created in each p-type channel region 4a having the n⁺-type impurity region 5 so that the p-type channel regions 4a can serve as IGBT portions capable of performing an IGBT action. The remaining p-type regions 4b of the p-type region 4 have no n⁺-type impurity region 5 and serve as space portions incapable of the IGBT action.

A p-type body layer 4c having a high concentration is formed in a surface part of the p-type channel region 4a of the p-type region 4, i.e., formed between the n⁺-type impurity regions 5 which are located on each side of the p-type channel region 4a. Therefore, in the IGBT portion, the p-type impurity concentration of the surface part of the p-type region 4 is high, and in the space portion, the p-type impurity concentration of the surface part of the p-type region 4b is low. Specifically, the p-type body layer 4c has a p-type impurity concentration of $4 \times 10^{19}$ cm$^{-3}$, so that in the IGBT portion, the p-type impurity concentration of the surface part of the p-type region 4 is high.

The impurity concentration of the n⁺-type impurity region 5 is higher than that of the n⁻-type drift layer 1. The n⁺-type impurity region 5 is terminated in the p-type region 4 and in contact with a side surface of the trench 6. Specifically, the n⁺-type impurity region 5 extends like as rod along a longitudinal direction of the trench 6 and is terminated inside the end of the trench 6.

The trench 6 is deeper than the p-type region 4 and has a depth of from 3 μm to 6 μm. As mentioned above, the trenches 6 are arranged at a predetermined pitch. Each trench 6 is filled with a gate insulation layer 7 and a gate electrode 8. The gate insulation layer 7 covers an inner surface of the trench 6. The gate electrode 8 is made of doped polysilicon or the like and formed on a surface of the gate insulation layer 7. The gate electrodes 8 are electrically connected to each other in a cross-section different from that shown in FIG. 1 so that the same gate voltage can be applied to the gate electrodes 8.

Further, the n⁺-type impurity region 5 and the p-type channel region 4a are electrically connected to an upper electrode 10 corresponding to the emitter electrode through contact holes 9a of an interlayer dielectric 9. Although not shown in the drawings, a passivation film covering the upper electrode 10 and wires are formed. A lower electrode 11 is formed on the back side of the p⁺-type impurity region 3, and thus the IGBT 100 is formed.

An n-type region (hole stopper (HS) layer) 12 is located in the middle of the p-type region 4b in the thickness direction of the p-type region 4b and connects adjacent trenches 6. Because of the n-type region 12, when the IGBT portion performs the IGBT action, carriers can be accumulated in the p-type region 4b at a position below the n-type region 12. If there is no n-type region 12, holes flows toward the upper electrode 10 through the p-type region 4b, so that an ON-voltage will be increased. To reduce the ON-voltage, it is preferable that as many holes as possible be accumulated at the time of the IGBT action so that conductivity modulation can occur. Because of the n-type region 12, carriers are accumulated in the p-type region 4b at a position below the n-type region 12. Therefore, the conductivity modulation can occur, and the ON-voltage can be reduced.

In contrast, in the outer voltage-breakdown resistant region, although a cross-section is not shown, a p-type diffusion layer is formed in the surface part of the $n^-$-type drift layer 1. The p-type diffusion layer surrounds the cell region and is deeper than the p-type region 4. Further, a p-type guard ring having a multilayer-structure is formed around the p-type diffusion layer. Thus, an outer voltage-breakdown resistant structure is formed in the outer voltage-breakdown resistant region. The outer voltage-breakdown resistant structure uniformly expands the electric field so that a breakdown voltage of the semiconductor device can be improved.

The semiconductor device having the IGBT 100 according to the present embodiment is structured in a manner described above. Next, a method of manufacturing the semiconductor device is described. Since the semiconductor device according to the present embodiment can be manufactured by almost the same method as a conventional semiconductor device, the description is focused on different parts from the conventional semiconductor device.

Firstly, a semiconductor substrate as a raw material for the $n^-$-type drift layer 1 is prepared, and a surface treatment, such as polishing, for surface planarization is performed as a raw material treatment process. Then, an ion implantation and thermal diffusion process for forming the p-type region 4, a process for forming the trench 6, a process for forming the gate insulation layer 7 and the gate electrode 8, and an ion implantation and thermal diffusion process for forming the p-type body region 4c and the $n^+$-type impurity region 5 are performed. Then, a process for forming the contact hole 9a is performed after the interlayer dielectric 9 is formed. Further, the upper electrode 10 is formed by patterning an electrode material such as aluminum. Then, although not shown in the drawings, the passivation film made of polyimide or the like is formed. In this way, a manufacturing process for a front side of the substrate is finished.

Next, the back side of the semiconductor substrate, which provides the $n^-$-type drift layer 1, is grinded to a desired thickness. If necessary, an etching process is performed for surface planarization. Then, a phosphorus ion implantation process for forming the phosphorus FS layer 2a and a boron ion implantation process for forming the $p^+$-type impurity region 3 are performed. Then, a local thermal treatment, which does not affect the front side, is performed by laser annealing to diffuse the implanted ions. Then, the lower electrode 11 is formed by depositing an electrode material such as aluminum. Then, a process for forming the proton FS layer 2b including a proton irradiation process and a low-temperature annealing process is performed.

For example, in the proton irradiation process of the process for forming the proton FS layer 2b, proton doping is performed using an accelerator under conditions that the accelerating voltage is 4 MeV and the dose amount is $1 \times 10^{13}$ $cm^{-2}$ or more. When the proton FS layer 2b is formed at such an accelerating voltage, the impurity concentration of the proton FS layer 2b peaks inside the phosphorus FS layer 2a and gradually, continuously decreases at a depth greater than the phosphorus FS layer 2a from the back side of the $n^-$-type drift layer 1.

For example, a full width at half-maximum $\Delta R(\mu m)$ and a range Rp with respect to a proton accelerating voltage (MeV) can be represented as shown in FIG. 3(a), and a depth (range) Rp and a proton concentration N can have a relationship as shown in FIG. 3(b). Therefore, the width of the proton FS layer 2b can be determined based on the accelerating voltage. Further, the peak depth Rp can be adjusted by adjusting a thickness of an absorber (absorbing agent).

As described above, in the semiconductor device according to the present embodiment, the FS layer 2 includes the phosphorus FS layer 2a and the proton FS layer 2b, and the impurity concentration of the proton layer (2b) gradually decreases. Thus, as compared to when the FS layer 2 is made of only proton, the impurity concentration of the proton FS layer 2b can decrease. Accordingly, as compared to when the FS layer 2 is formed by implantation of proton only, productivity is improved so that an increase in the manufacturing cost can be reduced.

Further, the impurity concentration of the proton FS layer 2b gradually, continuously decreases at a depth greater than the phosphorus FS layer 2a from the back side of the $n^-$-type drift layer 1. Thus, a difference in a n-type impurity concentration at a boundary between the proton FS layer 2b and the $n^-$-type drift layer 1 becomes small. Therefore, it is possible to relieve an electric field concentration, ensure a breakdown voltage, and reduce a switching surge.

Further, in the semiconductor device according to the present embodiment, for example, the FS layer 2 is formed such that the proton FS layer 2b has the diffusion depth of 15 $\mu m$ or less and has the n-type impurity concentration of $3 \times 10^{14}$ $cm^{-3}$ or more. These values are set based on the examination results which have been conducted to evaluate the breakdown voltage observed when a defect occurs in the phosphorus FS layer 2a.

Figure 5:
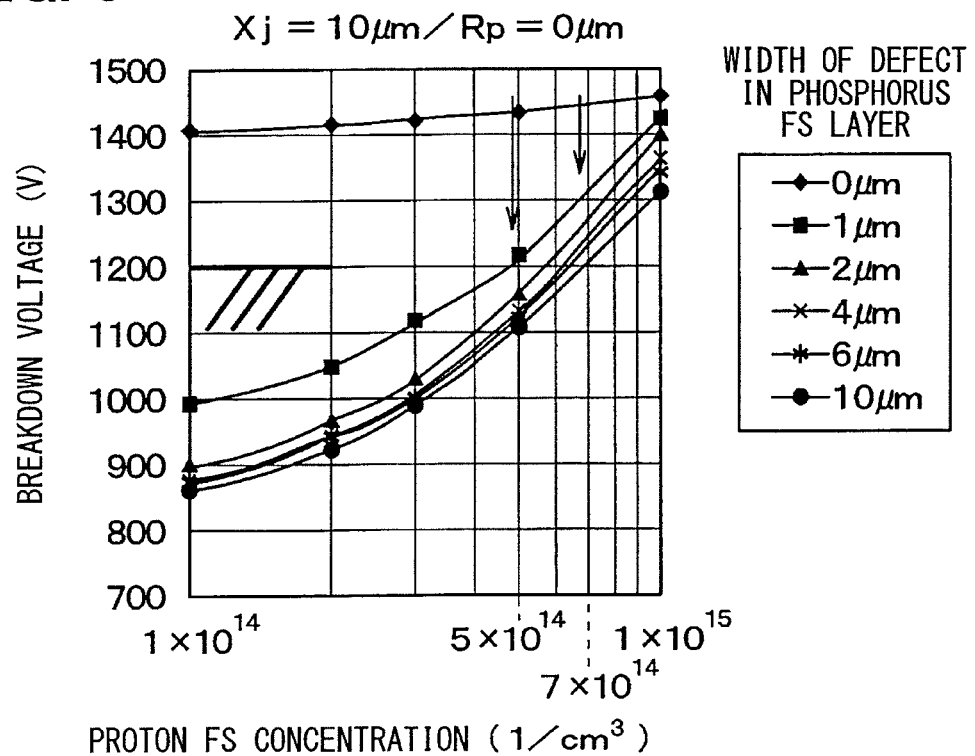
Figure 6:
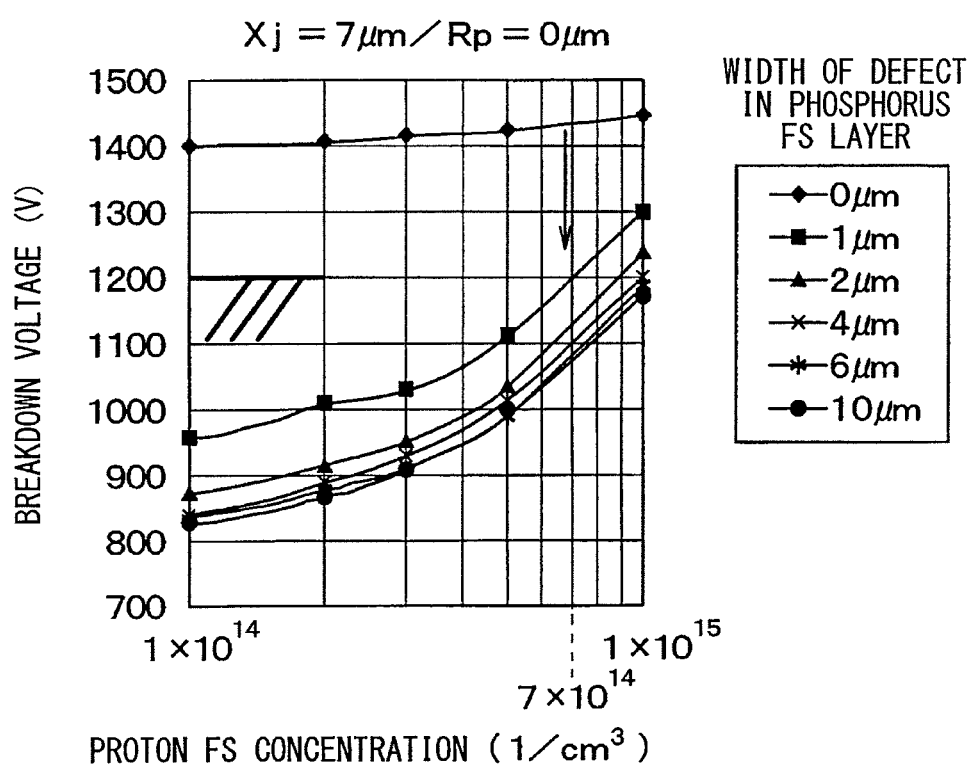

FIGS. 4-6 show results of simulations conducted to evaluate a relationship between the n-type impurity concentration of the proton FS layer 2 and the breakdown voltage by keeping the raw material concentration at $0.75 \times 10^{14}$ $cm^{-3}$ while changing a depth Xj of the proton FS layer 2b, a peak depth Rp of the proton FS layer 2b, and the width of the defect in the phosphorus FS layer 2a.

As shown in FIGS. 4-6, basically, the breakdown voltage of the semiconductor device depends on the n-type impurity concentration of the proton FS layer 2b, specifically, depends on a concentration ratio of the proton FS layer 2b with respect to a raw material concentration, and the breakdown voltage increases with an increase in the concentration ratio. When there is no defect (defect width=0 $\mu m$), the breakdown voltage of from 1400V to 1500V can be obtained irrespective of the depth Xj of the proton FS layer 2b and the peak depth Rp (i.e., the distance from the outermost surface of the back side of the semiconductor substrate) of the proton FS layer 2b.

However, when the defect occurs, the breakdown voltage decreases depending on the defect width. Further, the amount of the decrease varies depending on the depth Xj of the proton FS layer 2b. Even when the concentration ratio of the proton FS layer 2b with respect to the raw material concentration is small, the amount of the decrease becomes smaller as the depth Xj is larger.

Specifically, as shown in FIG. 4, if the depth Xj of the proton FS layer 2b is 15 $\mu m$, and the peak depth Rp of the proton FS layer 2b is 0 $\mu m$, the amount of the decrease in the breakdown voltage of the semiconductor device can be reduced to about half the maximum amount of the decrease when the impurity concentration of the proton FS layer 2b is $3 \times 10^{14}$ cm$^{-3}$ or more. That is, assuming that an intended breakdown voltage is 1500V, the breakdown voltage decreases up to 900V, and the maximum amount of the decrease is 600V. Since the amount of the decrease is about the half (300V), the breakdown voltage can be 1200V or more. In this case, since the raw material concentration is $0.75 \times 10^{14}$ cm$^{-3}$ or more, the decrease in the breakdown voltage can be reduced to about half the maximum amount of the decrease when the concentration ratio of the proton FS layer 2b with respect to the raw material concentration is four times or more. Preferably, when the impurity concentration of the proton FS layer 2b is $5 \times 10^{14}$ cm$^{-3}$ or more, i.e., when the concentration ratio of the proton FS layer 2b with respect to the raw material concentration is seven times or more, the breakdown voltage can be 1300V or more.

Further, as shown in FIG. 5, if the depth Xj of the proton FS layer 2b is 10 μm, and the peak depth Rp of the proton FS layer 2b is 0 μm, the amount of the decrease in the breakdown voltage of the semiconductor device can be reduced to about half the maximum amount of the decrease when the impurity concentration of the proton FS layer 2b is $5 \times 10^{14}$ cm$^{-3}$ or more. In this case, since the raw material concentration is $0.75 \times 10^{14}$ cm$^{-3}$ or more, the decrease in the breakdown voltage can be reduced to about half the maximum amount of the decrease when the concentration ratio of the proton FS layer 2b with respect to the raw material concentration is seven times or more. Preferably, when the impurity concentration of the proton FS layer 2b is $7 \times 10^{14}$ cm$^{-3}$ or more, i.e., when the concentration ratio of the proton FS layer 2b with respect to the raw material concentration is ten times or more, the breakdown voltage can be 1300V or more.

Likewise, as shown in FIG. 6, if the depth Xj of the proton FS layer 2b is 7 μm, and the peak depth Rp of the proton FS layer 2b is 0 μm, the amount of the decrease in the breakdown voltage of the semiconductor device can be reduced to about half the maximum amount of the decrease when the impurity concentration of the proton FS layer 2b is $7 \times 10^{14}$ cm$^{-3}$ or more. In this case, since the raw material concentration is $0.75 \times 10^{14}$ cm$^{-3}$ or more, the decrease in the breakdown voltage can be reduced to about half the maximum amount of the decrease when the concentration ratio of the proton FS layer 2b with respect to the raw material concentration is ten times or more. Preferably, according to the simulation result, when the impurity concentration of the proton FS layer 2b is $1 \times 10^{15}$ cm$^{-3}$ or more, i.e., when the concentration ratio of the proton FS layer 2b with respect to the raw material concentration is fourteen times or more, the breakdown voltage can be 1300V or more.

Figure 7:
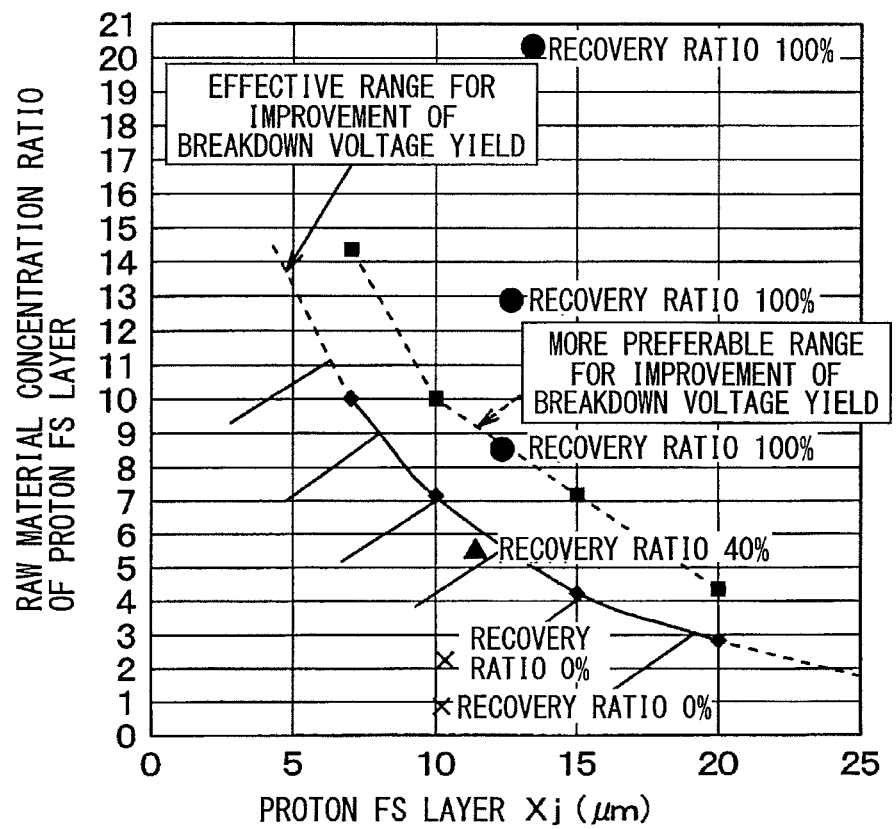
FIG. 7 is a graph illustrating a summary of the simulation results.

FIG. 7 is a graph illustrating a summary of the simulation results to calculate the breakdown voltage. It is noted that FIG. 7 also shows the result of the simulation conducted under conditions that the depth Xj of the proton FS layer 2b is 10 μm and the peak depth Rp of the proton FS layer 2b is 0 μm. Although each result is based on the condition that the peak depth Rp of the proton FS layer 2b is 0 μm, the same result was obtained as long as the peak position is in the phosphorus FS layer 2a.

Therefore, as shown in FIG. 7, if the depth Xj of the proton FS layer 2b is 20 μm or less, the amount of the decrease in the breakdown voltage can be reduced by half when the concentration ratio of the proton FS layer 2b with respect to the raw material concentration is three times or more and can be further reduced when the concentration ratio of the proton FS layer 2b with respect to the raw material concentration is four times or more. If the depth Xj of the proton FS layer 2b is 15 μm or less, the amount of the decrease in the breakdown voltage can be reduced by half when the concentration ratio of the proton FS layer 2b with respect to the raw material concentration is four times or more and can be further reduced when the concentration ratio of the proton FS layer 2b with respect to the raw material concentration is seven times or more. If the depth Xj of the proton FS layer 2b is 10 μm or less, the amount of the decrease in the breakdown voltage can be reduced by half when the concentration ratio of the proton FS layer 2b with respect to the raw material concentration is seven times or more and can be further reduced when the concentration ratio of the proton FS layer 2b with respect to the raw material concentration is ten times or more. If the depth Xj of the proton FS layer 2b is 7 μm or less, the amount of the decrease in the breakdown voltage can be reduced by half when the concentration ratio of the proton FS layer 2b with respect to the raw material concentration is ten times or more and can be further reduced when the concentration ratio of the proton FS layer 2b with respect to the raw material concentration is fourteen times or more.

Figure 8:
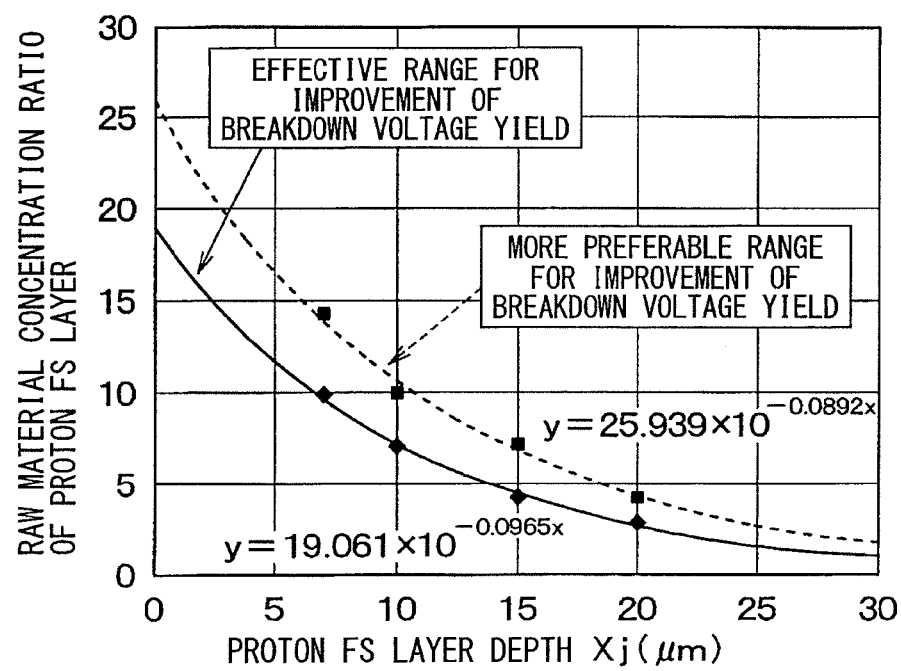
FIG. 8 is a graph illustrating approximate curves representing the results shown in FIG. 7.

A range where the amount of the decrease in the breakdown voltage can be reduced by half is defined as an effective range for a breakdown-voltage yield improvement, and a range where the amount of the decrease in the breakdown voltage can be reduced by more than half is defined as a more preferable range for the breakdown-voltage yield improvement. The effective range and the more preferable range for the breakdown-voltage yield improvement can be represented as approximate curves shown in FIG. 8. The approximate curves can be expressed by the following formulas 1 and 2. In the formulas 1 and 2, x represents the depth Xj of the proton FS layer 2b, and y represents values on boundaries of the effective range and the more preferable range for the breakdown-voltage yield improvement.

$$y = 19.061 \times 10^{-0.00965x} \quad \text{(Formula 1)}$$

$$y = 25.939 \times 10^{-0.0892x} \quad \text{(Formula 2)}$$

Therefore, when the concentration ratio of the proton FS layer 2b with respect to the raw material concentration is greater than y given by the formula 1, the breakdown-voltage yield can be effectively improved. Further, when the concentration ratio is greater than y given by the formula 2, the breakdown-voltage yield can be more effectively improved.

Figure 9:
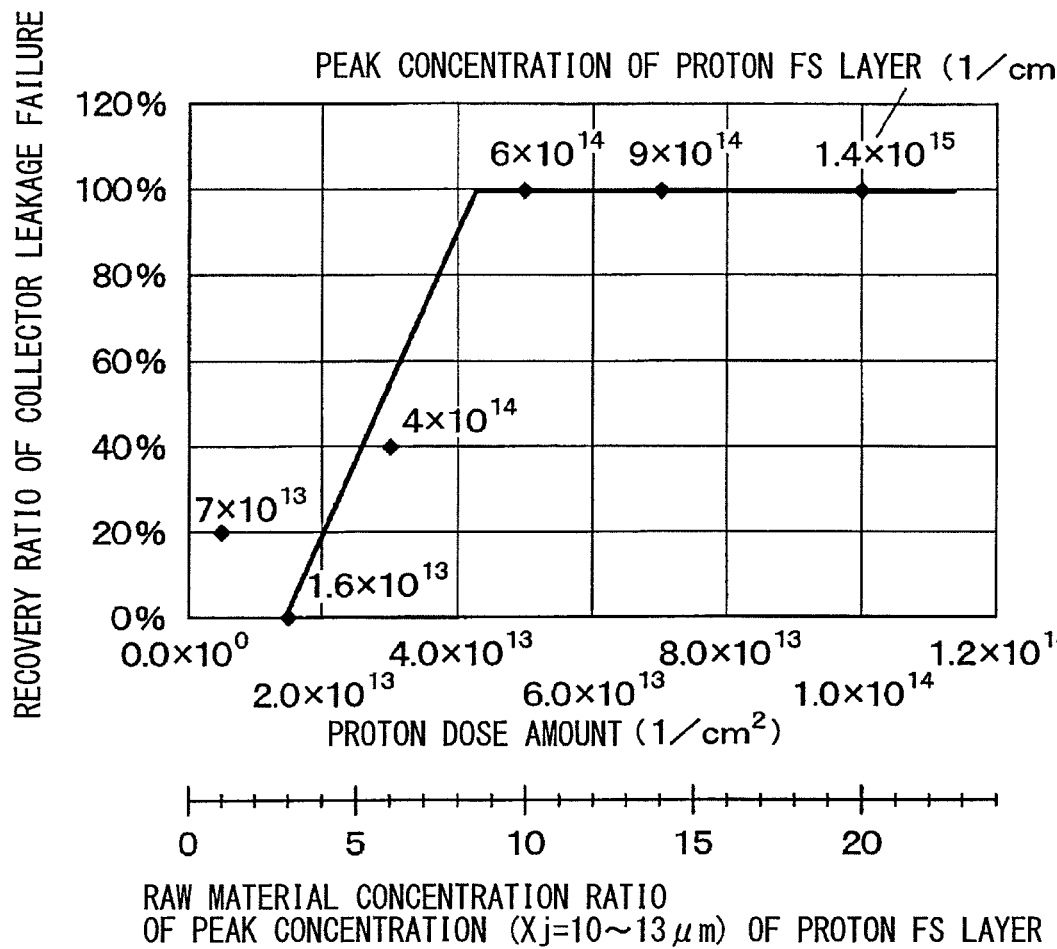
FIG. 9 is a graph illustrating a result of an experiment conducted to evaluate a contact leakage failure while changing the dose amount of proton.
Figure 10:
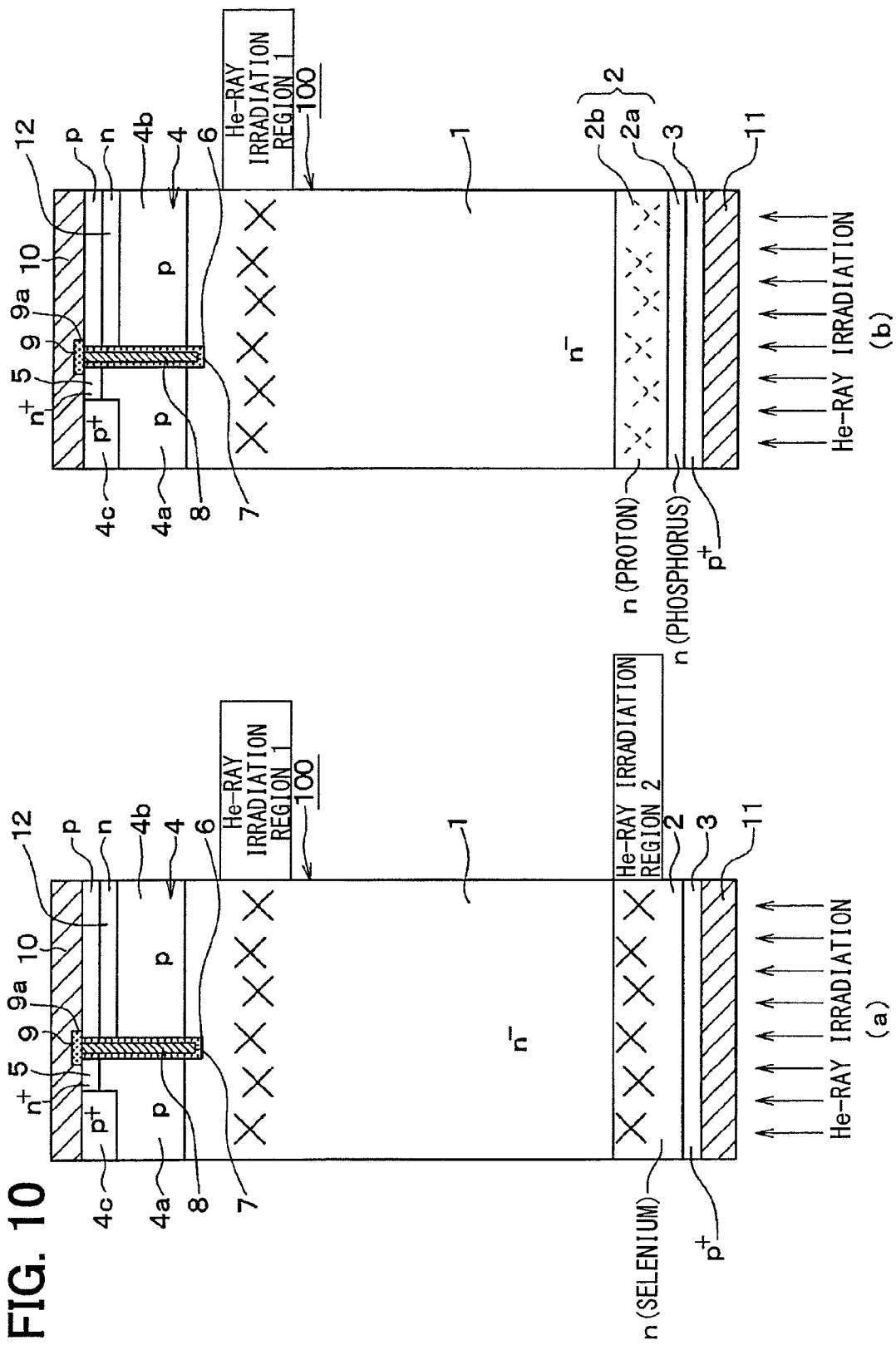
FIG. 10(a) is a diagram illustrating a cross-sectional view showing a He-ray irradiation when there is no proton FS layer 2b.
FIG. 10(b) is a diagram illustrating a cross-sectional view showing a He-ray irradiation when there is a proton FS layer 2b.

To examine the effective range for the breakdown-voltage yield improvement shown in FIG. 7, a recovery ratio of a contact leakage failure, i.e., a leakage failure due to the defect in the phosphorus FS layer 2a was measured while the dose amount of proton was changed. The experiment was conducted under conditions that the raw material concentration is $7 \times 10^{13}$ cm$^{-3}$ and the depth Xj of the proton FS layer 2b ranges from about 10 to 13 μm. As shown in FIG. 9, a result of the experiment indicates that when the dose amount of proton was $4 \times 10^{13}$ cm$^{-2}$ or more, almost 100% of the contact leakage failure was recovered. In FIG. 9, the peak concentration of the proton FS layer 2b indicates a peak value of the impurity concentration in the proton FS layer 2b when the dose amount of proton is a predetermined value.

Further, as shown in FIG. 9, since a scale of the dose amount of proton can be replaced with a scale of the peak concentration of the proton FS layer 2b when the raw material concentration is $7 \times 10^{13}$ cm$^{-3}$, a relationship between this peak concentration and the recovery ratio of the contact leakage failure. The following result can be obtained by plotting this in FIG. 7 according to the depth Xj of the proton FS layer 2b. The recovery ratio is very low, 0% or 20% outside the effective range for the breakdown-voltage yield improvement, and the recovery ratio is relatively high, 40% close to the effective range, but slightly outside the effective range. As shown in the drawing, the recovery ratio is high within the effective range and 100% within the more preferable range.

As described above, it has been shown that the contact leakage failure is recovered within the effective range for the breakdown-voltage yield improvement. From this, it can be seen that the amount of the decrease in the breakdown voltage can be reduced by designing the depth Xj and the concentration of the proton FS layer $2b$ within the effective range for the breakdown-voltage yield improvement.

In the above, the breakdown voltage is defined on the basis of the concentration ratio of the proton FS layer $2b$ with respect to the raw martial concentration. This is because since a breakdown voltage design depends basically on a raw material concentration, the breakdown voltage depends on the concentration ratio of the proton FS layer $2b$ with respect to the raw martial concentration. Therefore, even if the raw martial concentration varies, the amount of the decrease in the breakdown voltage can be reduced by selecting the concentration ratio of the proton FS layer $2b$ with respect to the raw martial concentration in the same manner as described above.

Further, when the proton FS layer $2b$ is formed in the manner as described in the present embodiment, He-ray irradiation near the FS layer can be omitted. This is explained with reference to FIGS. $10(a)$ and $(b)$.

Normally, lifetime control is performed by performing the He-ray irradiation from the back side of the substrate after the element is formed. A reason for performing the He-ray irradiation from the back side of the substrate is to prevent the gate insulation layer 7 and the like on the front side of the substrate from being damaged by the He-ray irradiation. As shown in FIG. $10(a)$, if the FS layer 2 is made of an impurity other than proton, the He-ray irradiation is applied to a region (He-ray irradiation region 1) of the n$^-$-type drift layer 1 near the p-type region 4 and applied to a region (He-ray irradiation region 2) inside the FS layer 2. In contrast, proton becomes a donor and can be used to form the FS layer 2. Further, since proton has a function as a lifetime killer, lifetime control can be performed by proton. Therefore, as shown in FIG. $10(b)$, there is no need to apply the He-ray irradiation to the region inside the FS layer 2, and the lifetime control can be simplified.

Second Embodiment

A second embodiment of the present disclosure is described. The present embodiment differs from the first embodiment in that not only the IGBT but also a diode (freewheeling diode) is formed on the same semiconductor substrate. Since the others are the same as the first embodiment, only different parts from the first embodiment are described.

FIGS. $11(a)$, $(b)$, and $(c)$ are diagrams illustrating a semiconductor device having an IGBT with a diode as a vertical semiconductor element. FIG. $11(a)$ illustrates a top layout view, FIG. $11(b)$ illustrates a cross-sectional view taken along the line XIB-XIB in FIG. $11(a)$, and FIG. $11(c)$ illustrates a cross-sectional view taken along the line XIC-XIC in FIG. $11(a)$. FIG. $12(a)$ is a graph showing an impurity concentration profile in a cross-section taken along the line XIIA-XIIA in FIG. $11(b)$, and FIG. $12(b)$ is a graph showing an impurity concentration profile in a cross-section taken along the line XIIB-XIIB in FIG. $12(b)$.

As shown in FIGS. $11(a)$, $(b)$, and $(c)$, in the semiconductor device according to the present embodiment, the IGBT 100 and a diode 200 are formed in the semiconductor substrate which provides the n$^-$-type drift layer 1. As shown in FIG. $11(a)$, the cell region includes the IGBT formation region where the IGBT 100 is formed and a diode formation region where the diode 200 is formed. The outer voltage-breakdown resistant region is located around the cell region. That is, the IGBT formation region and the diode formation region are located in the central part of the chip which provides the semiconductor device. The IGBT formation region and the diode formation region are alternately arranged in the cell region.

In the IGBT formation region and the diode region of the cell region, the n-type FS layer 2 is formed in the surface part of the back side of the n$^-$-type drift layer 1. The FS layer 2 includes the phosphorus FS layer $2a$ and the proton FS layer $2b$. For example, as shown in concentration profiles of FIGS. $12(a)$ and $(b)$, the FS layer 2 is structured in the same manner as that of the first embodiment. In the IGBT formation region, the p$^+$-type impurity region 3 corresponding to the collector region is formed in the surface part of the FS layer 2. In the diode formation region, an n$^+$-type impurity region 20 corresponding to a cathode region is formed in the surface part of the FS layer 2.

The n$^+$-type impurity region 20 is formed by implantation of n-type impurities such as phosphorus. For example, the n$^+$-type impurity region 20 has a diffusion depth of 0.5 µm and has an n-type impurity concentration of $1\times10^{20}$ cm$^{-3}$. The back side of the n$^-$-type drift layer 1 is mainly occupied by the p$^+$-type impurity region 3 and partially occupied by the n$^+$-type impurity region 20. A region where the p$^+$-type impurity region 3 is formed is defined as the IGBT formation region, and the A region where the n$^+$-type impurity region 20 is formed is defined as the diode formation region. The IGBT formation region and the diode formation region are alternately, repeatedly arranged at a predetermined width to form a stripe shape. In FIG. $11(a)$, the IGBT formation region and the diode formation region are shown in a simplified manner. In fact, the number of repetitions of the arrangement is larger than that shown in the drawing.

The other structure of the IGBT formation region is basically the same as the first embodiment, but part of the p-type region 4 performs a diode action. That is, out of the p-type regions 4 sectioned by the trenches 6, the p-type channel region $4a$ serves as the IGBT portion, but the p-type region 4 of the space portion serves a p-type anode region capable of performing the diode action not the IGBT action.

In the diode formation region, like in the IGBT formation region, the p-type region 4 having a predetermined thickness is formed in the surface part of the n$^-$-type drift layer 1. This p-type region 4 also serves as the p-type anode region $4d$. According to the present embodiment, the p-type region 4 in the diode formation region has the same impurity concentration as the p-type region 4 in the IGBT formation region. Alternatively, the impurity concentration of the p-type region 4 in the diode formation region can be independent of that of the p-type region 4 in the IGBT formation region.

In the diode formation region, the p-type anode region $4d$ as an anode forms a PN junction with the n$^-$-type drift layer 1 and the n$^+$-type impurity region 3 as a cathode, thereby forming the diode 200. In the diode 200, the p-type anode region $4d$ is electrically connected to the upper electrode 10 as an anode electrode, and the n$^+$-type impurity region 3 is electrically connected to the lower electrode 11 as a cathode electrode.

Therefore, the IGBT 100 and the diode 200 are connected in parallel on the same chip in such a manner that the emitter and the anode are electrically connected and the collector and the cathode are electrically connected.

The semiconductor device having the IGBT 100 and the diode 200 according to the present embodiment is structured in a manner described above. Even in the semiconductor device having the IGBT 100 and the diode 200, the FS layer 2 includes the phosphorus FS layer 2a and the proton FS layer 2b which are structured in the same manner as in the first embodiment. Thus, the same advantages as in the first embodiment can be obtained.

Third Embodiment

A third embodiment of the present disclosure is described. According to the present embodiment, a diode is formed as a vertical semiconductor element and has almost the same structure as the diode formation region of the second embodiment. Therefore, only different parts from the second embodiment are described.

Figure 14:
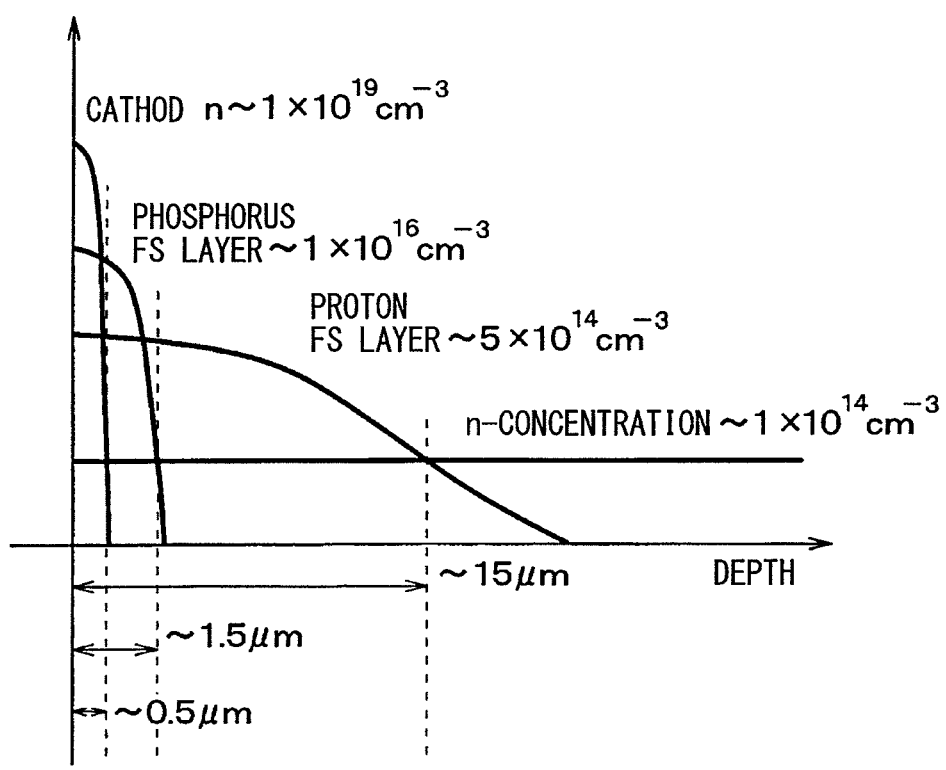
FIG. 14 is a graph showing an impurity concentration profile in a cross-section taken along the line XIV-XIV in FIG. 13(b)
Figure 15:
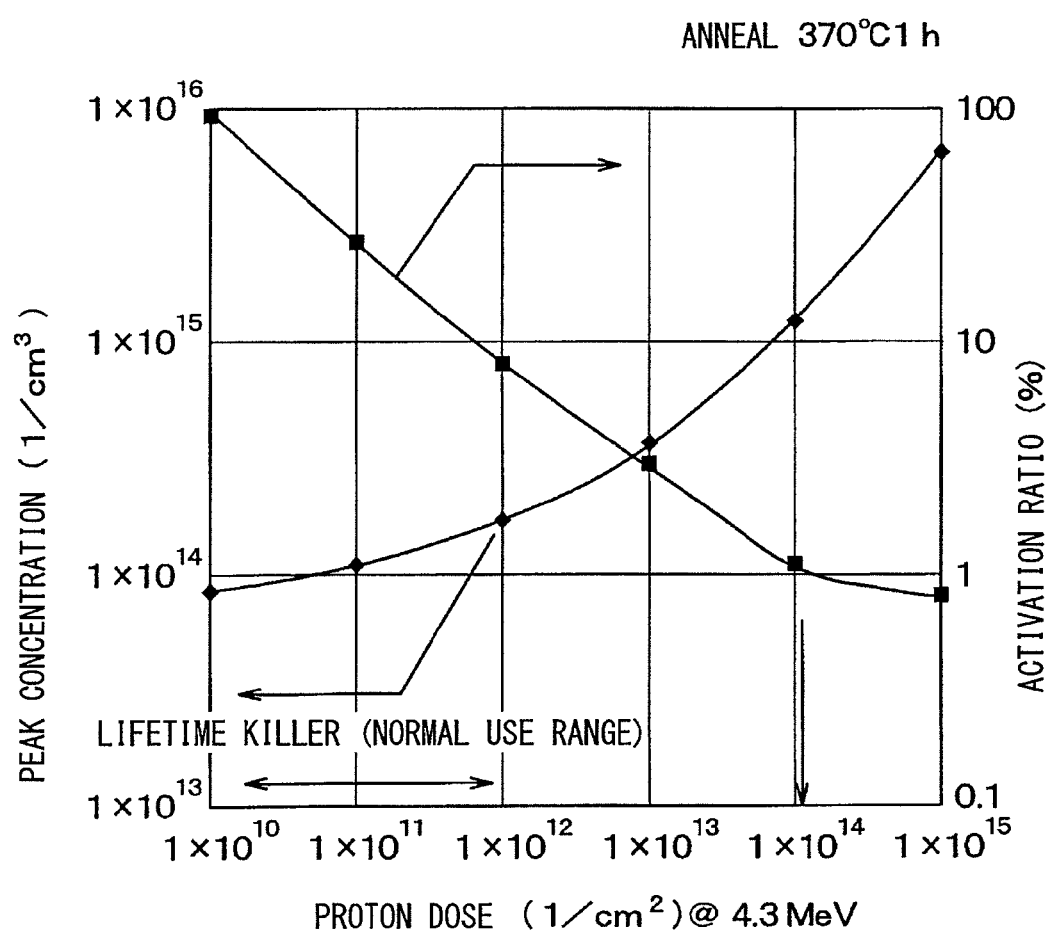
FIG. 15 is a diagram showing a peak concentration and an activation ratio with respect to the dose amount when a doping with proton is performed at an accelerating voltage of 4.3 MeV.

FIGS. 13(a) and (b) are diagrams illustrating a semiconductor device having a diode as a vertical semiconductor element. FIG. 13(a) illustrates a top layout view, and FIG. 13(b) illustrates a cross-sectional view taken along the line XIIIB-XIIIB in FIG. 13(a). FIG. 14 is a graph showing an impurity concentration profile in a cross-section taken along the line XIV-XIV in FIG. 13(b).

As shown in FIGS. 13(a) and (b), in the semiconductor device according to the present embodiment, the diode 200 is formed in the semiconductor substrate which provides the $n^-$-type drift layer 1. As shown in FIG. 13(a), the cell region includes the diode formation region where the diode 200 is formed. The outer voltage-breakdown resistant region is located around the cell region. That is, the diode formation region is located in the central part of the chip which provides the semiconductor device.

In the diode region of the cell region, the n-type FS layer 2 is formed in the surface part of the back side of the $n^-$-type drift layer 1. The FS layer 2 includes the phosphorus FS layer 2a and the proton FS layer 2b. For example, as shown in a concentration profile of FIG. 14, the FS layer 2 is structured in the same manner as that of the second embodiment. The $n^+$-type impurity region 20 corresponding to the cathode region is formed in the surface part of the FS layer 2. This $n^+$-type impurity region 20 is structured in the same manner as that of the second embodiment. Further, the p-type region 4 serving as the p-type anode region is formed on the surface of the $n^-$-type drift layer 1, and the upper electrode 10 is formed on a surface of the p-type region 4. Further, the lower electrode 11 is formed on a surface of the $n^+$-type impurity region 20, so that the diode 200 is formed.

The semiconductor device having the diode 200 according to the present embodiment is structured in a manner described above. Even in the semiconductor device having only the diode 200, the FS layer 2 includes the phosphorus FS layer 2a and the proton FS layer 2b which are structured in the same manner as in the second embodiment. Thus, the same advantages as in the second embodiment can be obtained.

Other Embodiments

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the above embodiments, the IGBT 100 and the diode 200 are taken as examples of the vertical semiconductor elements. Alternatively, the present disclosure can be applied to a semiconductor device having other vertical semiconductor elements such as a LDMOS.

In the above embodiments, the FS layer 2a is made of phosphorus. Alternatively, the FS layer 2a can be made of arsenic (As) instead of phosphorus (P).

What is claimed is:

1. A semiconductor device having a vertical semiconductor element, the semiconductor device comprising:
   a semiconductor substrate which provides an n-type drift layer having a raw material concentration;
   a n-type or p-type semiconductor region formed on a back side of the drift layer;
   a n-type field stop layer formed from a back side of the semiconductor substrate to a depth greater than that of the semiconductor layer and having an impurity concentration higher than that of the drift layer;
   a p-type region formed on a front side of the drift layer;
   an upper electrode formed on the front side of the drift layer and being in contact with the p-type region; and
   a lower electrode formed on a back side of the drift layer and being in contact with the semiconductor region, wherein
   the vertical semiconductor element is configured to pass an electric current between the upper electrode and the lower electrode,
   the field stop layer includes a phosphorus/arsenic layer doped with phosphorus or arsenic and a proton layer doped with proton,
   the phosphorus/arsenic layer is formed from the back side of the semiconductor substrate to a predetermined depth,
   the proton layer is deeper than the phosphorus/arsenic layer, and
   an impurity concentration of the proton layer peaks inside the phosphorus/arsenic layer and gradually, continuously decreases at a depth greater than the phosphorus/arsenic layer.

2. The semiconductor device according to claim 1, wherein
   a depth of the proton layer is defined as x,
   a concentration ratio of the proton layer with respect to the raw material concentration is defined as y, and
   x and y satisfy the following formula: $y \geq 19.061 \times 10^{x \cdot 0.00965x}$.

3. The semiconductor device according to claim 2, wherein the depth of the proton layer is 20 μm or less, and
   the concentration ratio of the proton layer with respect to the raw material concentration is three times or more.

4. The semiconductor device according to claim 2, wherein the depth of the proton layer is 20 μm or less, and
   the concentration ratio of the proton layer with respect to the raw material concentration is four times or more.

5. The semiconductor device according to claim 2, wherein the depth of the proton layer is 15 μm or less, and
   the concentration ratio of the proton layer with respect to the raw material concentration is four times or more.

6. The semiconductor device according to claim 2, wherein the depth of the proton layer is 15 μm or less, and
   the concentration ratio of the proton layer with respect to the raw material concentration is seven times or more.

7. The semiconductor device according to claim 2, wherein the depth of the proton layer is 10 μm or less, and
   the concentration ratio of the proton layer with respect to the raw material concentration is seven times or more.

8. The semiconductor device according to claim 2, wherein the depth of the proton layer is 10 μm or less, and
   the concentration ratio of the proton layer with respect to the raw material concentration is ten times or more.

9. The semiconductor device according to claim 2, wherein the depth of the proton layer is 7 μm or less, and the concentration ratio of the proton layer with respect to the raw material concentration is ten times or more.

10. The semiconductor device according to claim 2, wherein the depth of the proton layer is 7 μm or less, and the concentration ratio of the proton layer with respect to the raw material concentration is fourteen times or more.

11. The semiconductor device according to claim 1, wherein the vertical semiconductor element is an IGBT and formed in a cell region, the cell region includes a p-type collector region provided by the semiconductor region, trenches, an n-type emitter region, a gate insulation layer, and a gate electrode, the trenches are arranged at a predetermined pitch and deeper than the p-type region to divide the p-type region into multiple portions, at least some of which provide a p-type channel region, the emitter region is formed in a surface part of the p-type channel region and extends along a side surface of the trench, the gate insulation layer is formed on a surface of the trench, the gate electrode is formed on a surface of the gate insulation layer, the upper electrode is in contact with the p-type channel region and the emitter region, and the lower electrode is in contact with the collector region.

12. The semiconductor device according to claim 1, wherein the vertical semiconductor element is formed in a cell region and an IGBT with a freewheeling diode, the IGBT is formed in a IGBT formation region of the cell region, the freewheeling diode is formed in a diode formation region of the cell region, the p-type region is formed in both the IGBT formation region and the diode formation region, the IGBT formation region includes a p-type collector region provided by the semiconductor region, trenches, an n-type emitter region, a gate insulation layer, and a gate electrode, the trenches are arranged at a predetermined pitch and deeper than the p-type region to divide the p-type region into multiple portions, at least some of which provide a p-type channel region, the emitter region is formed in a surface part of the p-type channel region and extends along a side surface of the trench, the gate insulation layer is formed on a surface of the trench, the gate electrode is formed on a surface of the gate insulation layer, the diode formation region includes an n-type cathode region provided by the semiconductor region and a p-type anode region provided by the p-type region, the upper electrode is in contact with the p-type channel region, the emitter region, and the p-type anode region, and the lower electrode is in contact with the collector region and the cathode region.

13. The semiconductor device according to claim 1, wherein the vertical semiconductor element is a diode, the semiconductor region provides an n-type cathode region, the p-type region provides a p-type anode region, the upper electrode is in contact with the p-type region serving as the p-type anode region, and the lower electrode is in contact with the cathode region.

* * * * *